(12) United States Patent
Houkes et al.

(10) Patent No.: US 7,265,813 B2
(45) Date of Patent: Sep. 4, 2007

(54) LITHOGRAPHIC APPARATUS AND DEVICE MANUFACTURING METHOD

(75) Inventors: Martijn Houkes, Sittard (NL); Hans Butler, Best (NL); Henrikus Herman Marie Cox, Eindhoven (NL)

(73) Assignee: ASML Netherlands B.V. (NL)

( * ) Notice: Subject to any disclaimer, the term of this patent is extended or adjusted under 35 U.S.C. 154(b) by 274 days.

(21) Appl. No.: 11/022,950

(22) Filed: Dec. 28, 2004

(65) Prior Publication Data

US 2006/0139613 A1    Jun. 29, 2006

(51) Int. Cl.
G03B 27/42 (2006.01)
G03B 27/58 (2006.01)

(52) U.S. Cl. .......................... 355/53; 355/72
(58) Field of Classification Search ................. 355/30, 355/53, 72–76; 318/560, 565
See application file for complete search history.

(56) References Cited

U.S. PATENT DOCUMENTS

| 4,509,852 | A | | 4/1985 | Tabarelli et al. |
| 5,757,149 | A | * | 5/1998 | Sato et al. .................. 318/135 |
| 6,504,162 | B1 | * | 1/2003 | Binnard et al. .......... 250/492.2 |
| 6,654,098 | B2 | * | 11/2003 | Asano et al. ................. 355/53 |
| 6,727,977 | B2 | * | 4/2004 | Butler ........................ 355/53 |
| 7,098,990 | B2 | * | 8/2006 | Butler ........................ 355/53 |
| 7,136,148 | B2 | * | 11/2006 | Eussen ....................... 355/53 |

FOREIGN PATENT DOCUMENTS

| EP | 03257072.3 | | 11/2002 |
| EP | 03252955.4 | | 5/2003 |
| EP | 1 420 302 A1 | | 11/2003 |
| JP | WO99/49504 | * | 9/1999 |
| WO | WO99/49504 A1 | | 9/1999 |
| WO | 2004/092845 | | 10/2004 |

OTHER PUBLICATIONS

European Search Report issued in EP 05 07 8034 dated Mar. 6, 2006.

* cited by examiner

Primary Examiner—Henry Hung Nguyen
(74) Attorney, Agent, or Firm—Pillsbury Winthrop Shaw Pittman LLP

(57) ABSTRACT

A lithographic apparatus includes a first movable element (such as an immersion liquid supply system), which is in operation in contact with a surface of a second movable element (such as a substrate table). Further, the lithographic apparatus includes a second element controller (such as a substrate table controller) to control a position quantity of the second movable element. Disturbance forces caused by, e.g., movements of the first and second movable elements with respect to each other, due to capillary forces disturb a position of the first and second movable elements. To at least partly correct a position of the second movable element due to such disturbance forces, the lithographic apparatus includes a feedforward control path to provide a disturbance force feedforward signal to the second element controller, the feedforward control path including a disturbance force estimator to estimate a disturbance force from a position quantity of the first movable element.

19 Claims, 6 Drawing Sheets

PRIOR ART

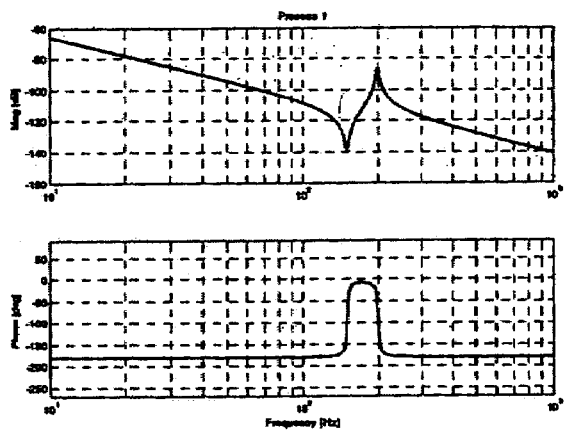 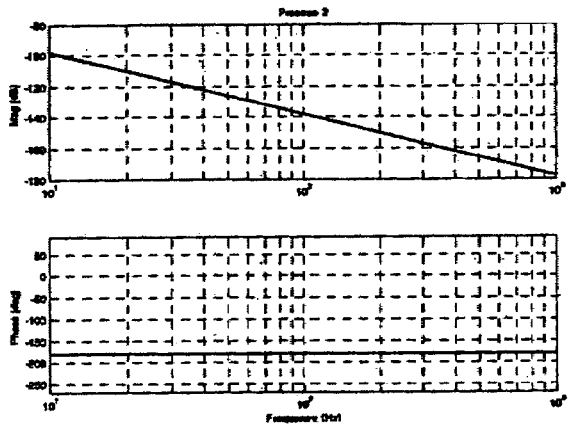
FIG. 8A  FIG. 8B
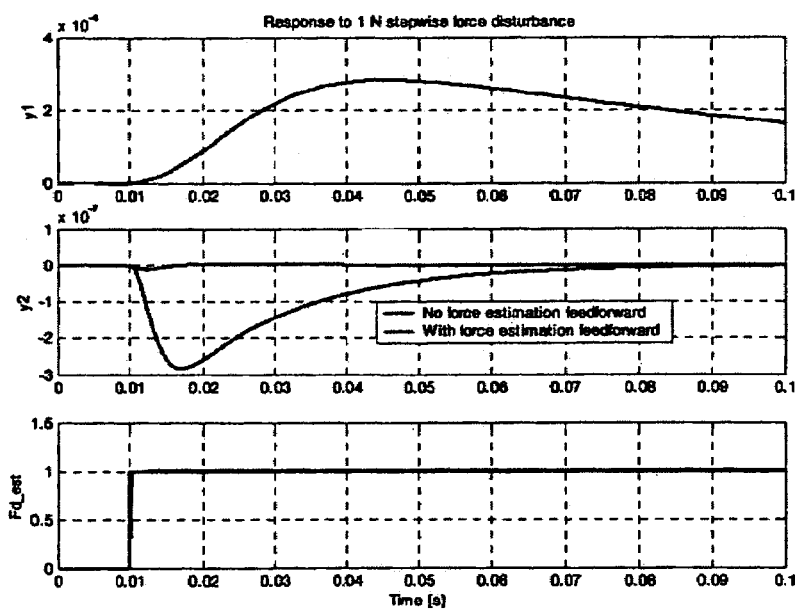
FIG. 9A
FIG. 9B
FIG. 9C

LITHOGRAPHIC APPARATUS AND DEVICE MANUFACTURING METHOD

FIELD

The present invention relates to a lithographic apparatus, a method for manufacturing a device, and a computer program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that circumstance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that should be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 schematically shows the arrangement in which liquid is supplied via inlet IN and is taken up on the other side of the element by outlet OUT which is connected to a low pressure source.

In the illustration of FIG. 2, the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal. Such as system with a gas seal is disclosed in European Patent Application No. 03252955.4 hereby incorporated in its entirety by reference.

Still another solution is depicted in FIG. 5. Here, the reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air but preferably $N_2$ or another inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity air flow inwards that confines the liquid.

In European Patent Application No. 03257072.3 the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

For each of the solutions as proposed above, the liquid supply system is in contact with a surface of the substrate. In the solutions as shown in FIGS. 2-5, the liquid is in a direct contact with a surface of the substrate, while other constructive elements as shown in the solutions according to FIGS. 2-5 may be in a direct or indirect contact with the surface of the substrate.

Positioning accuracy of the surface of the substrate with respect to a projection system (e.g. a projection lens) of the lithographic apparatus is high, as it is desirable that the surface of the substrate be in a focus plane of the projection system with a high accuracy to achieve an accurate imaging of a pattern to be projected onto the surface of the substrate. In a current implementation, a position error of 10 nm of the surface of the substrate with respect to the projection system is considered critical.

In operation, the liquid supply system moves with respect to the substrate, for example because different portions of the substrate are to be irradiated. The movements of the liquid supply system, as well as the movements of the liquid itself caused thereby, will result in forces acting on the substrate, hence resulting in displacements of the substrate, thus deteriorating an image quality of a projection by the lithographic apparatus onto the substrate.

Attempts have been made to correct such positioning errors of the substrate by a high speed, high accuracy controlling of a position of the substrate (or more specifically, a position of the substrate table), however due to the nature of the disturbance forces and the high requirements on the positioning accuracy, satisfactory results have not yet been obtained.

SUMMARY

It is desirable to improve an imaging quality of the lithographic apparatus and the device manufacturing method.

According to an embodiment of the invention, there is provided a lithographic apparatus including a first movable element; a second movable element, a surface of the second movable element being in operation in contact with the first movable element; and a second element controller to control a position quantity of the second movable element, wherein the lithographic apparatus further includes a feedforward control path to provide a disturbance force feedforward signal to the second element controller, the feedforward control path including a disturbance force estimator to estimate a disturbance force at least from a position quantity of the first movable element.

According to an embodiment of the invention, there is provided a device manufacturing method including: holding a substrate by a substrate table; controlling a position quantity of the substrate table by a substrate table controller; positioning a first movable element with respect to the substrate, the first movable element being in operation in contact with a surface of the substrate; estimating a disturbance force at least from a position quantity of the first element; providing a disturbance force feedforward signal based on the estimated disturbance force via a feedforward control path to the substrate table controller; and transferring a pattern from a patterning device onto the substrate.

According to an embodiment of the invention, there is provided a computer program including program instructions to, when loaded into a computer, execute the acts of estimating a disturbance force at least from a position quantity of the first element, and providing a disturbance force feedforward signal based on the estimated disturbance force via a feedforward control path to the substrate table controller according to the method according to an embodiment of the invention.

In yet another embodiment of the invention, there is provided a lithographic apparatus including: an illumination system configured to condition a beam of radiation; a patterning device support configured to support a patterning device, the patterning device configured to pattern the beam of radiation to form a patterned beam of radiation; a substrate support configured to hold a substrate; a projection system configured to project the patterned beam of radiation onto a target portion on the substrate, and a positioning system configured to position a first movable element relative to a second movable element, a surface of the second movable element being in contact with the first movable element, the system including a second element position controller configured to control a position quantity of the second movable element, and a feedforward control path configured to provide a disturbance force feedforward signal to the second element controller, the feedforward control path including a disturbance force estimator configured to estimate a disturbance force from a position quantity of the first movable element.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 8a and b depict frequency diagrams of a simulation with a lithographic apparatus according to an embodiment of the invention; and FIGS. 9a-c depict simulation results of the simulation as described with reference to FIGS. 8a and b.

DETAILED DESCRIPTION

Figure 1:
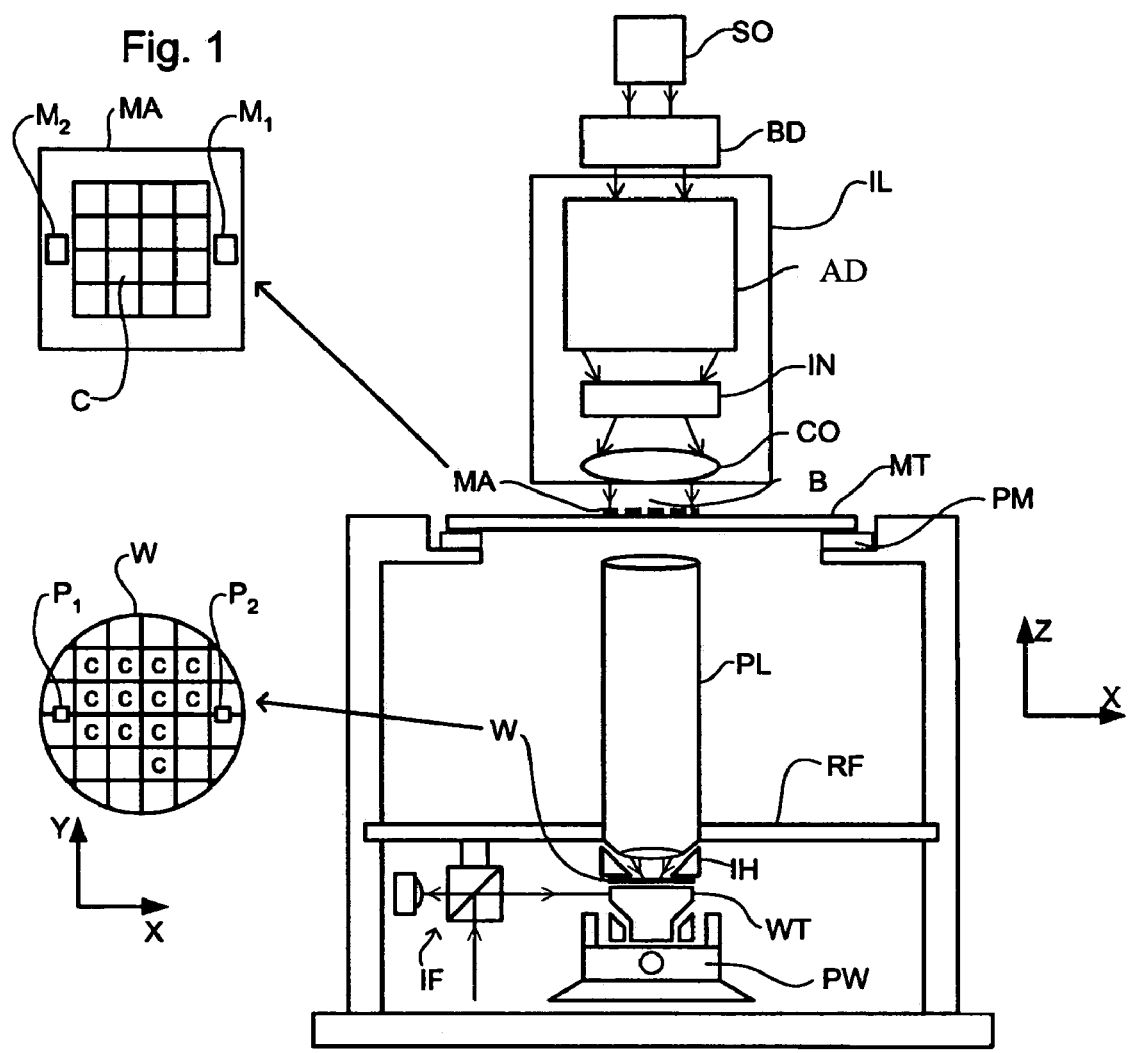
FIG. 1 depicts a lithographic apparatus according to an embodiment of the invention.
Figure 2:
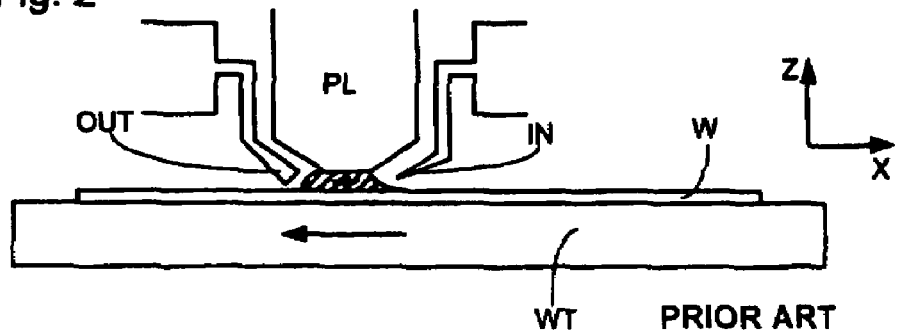
FIGS. 2 and 3 depict a liquid supply system used in a conventional lithographic projection apparatus.
Figure 3:
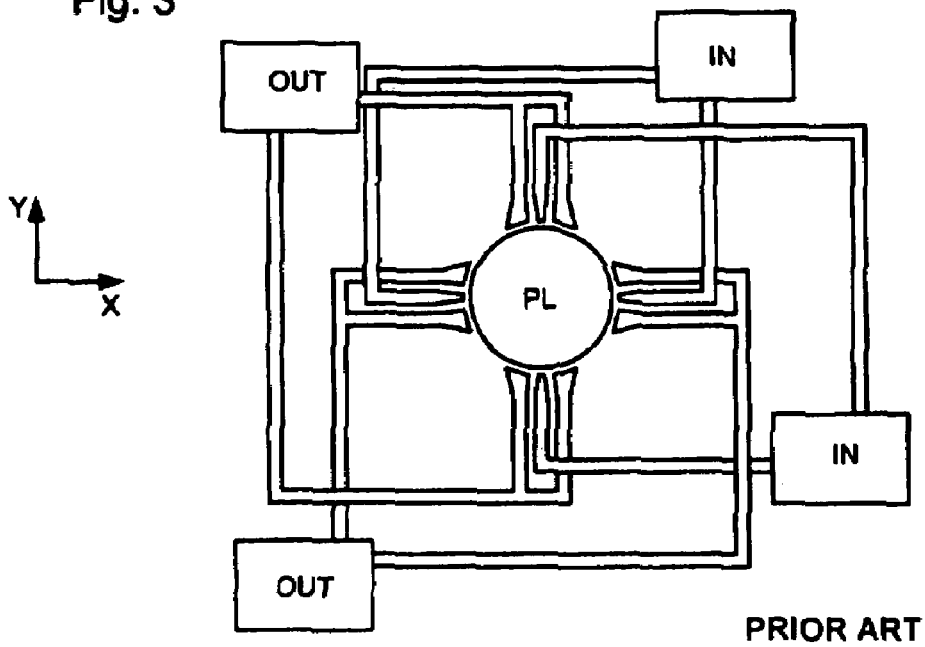
Figure 4:
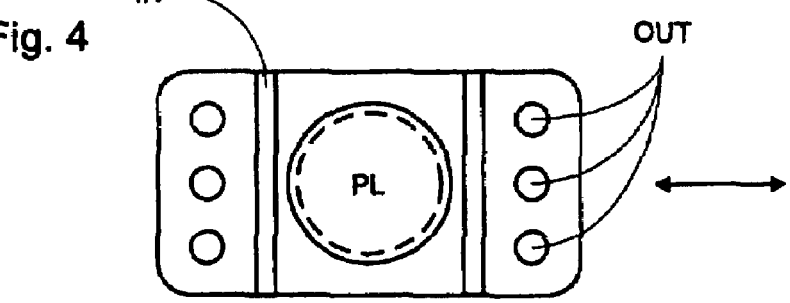
FIG. 4 depicts a liquid supply system according to another conventional lithographic projection apparatus.
Figure 4:
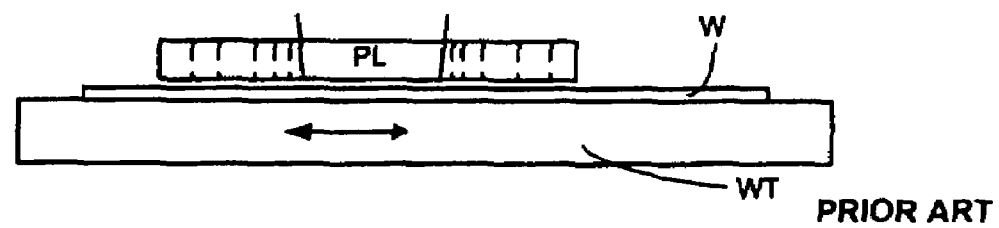
Figure 5:
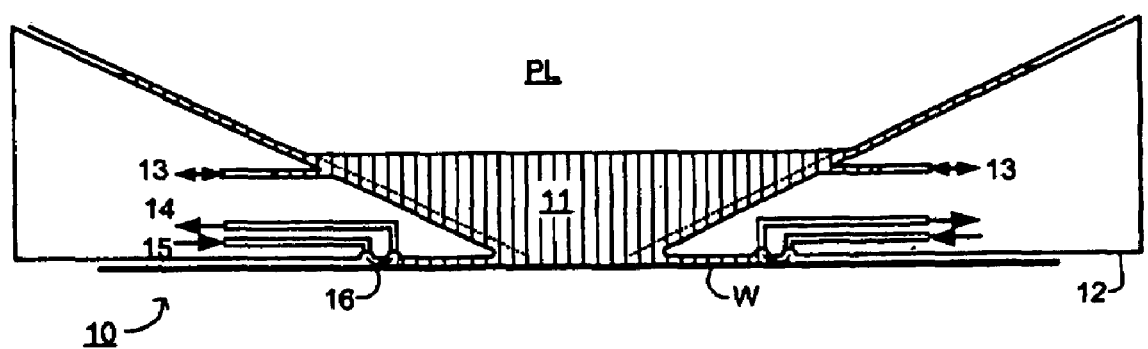
FIG. 5 depicts a liquid supply system according to still another conventional lithographic projection apparatus.

FIG. 1 schematically depicts a lithographic apparatus according to one embodiment of the invention. The apparatus includes an illumination system (illuminator) IL configured to condition a radiation beam B (e.g. UV radiation or DUV radiation), and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments of the liquid supply system (in FIG. 1 indicated by IH) have been depicted in and described with reference to FIGS. 2-5.

Figure 6:
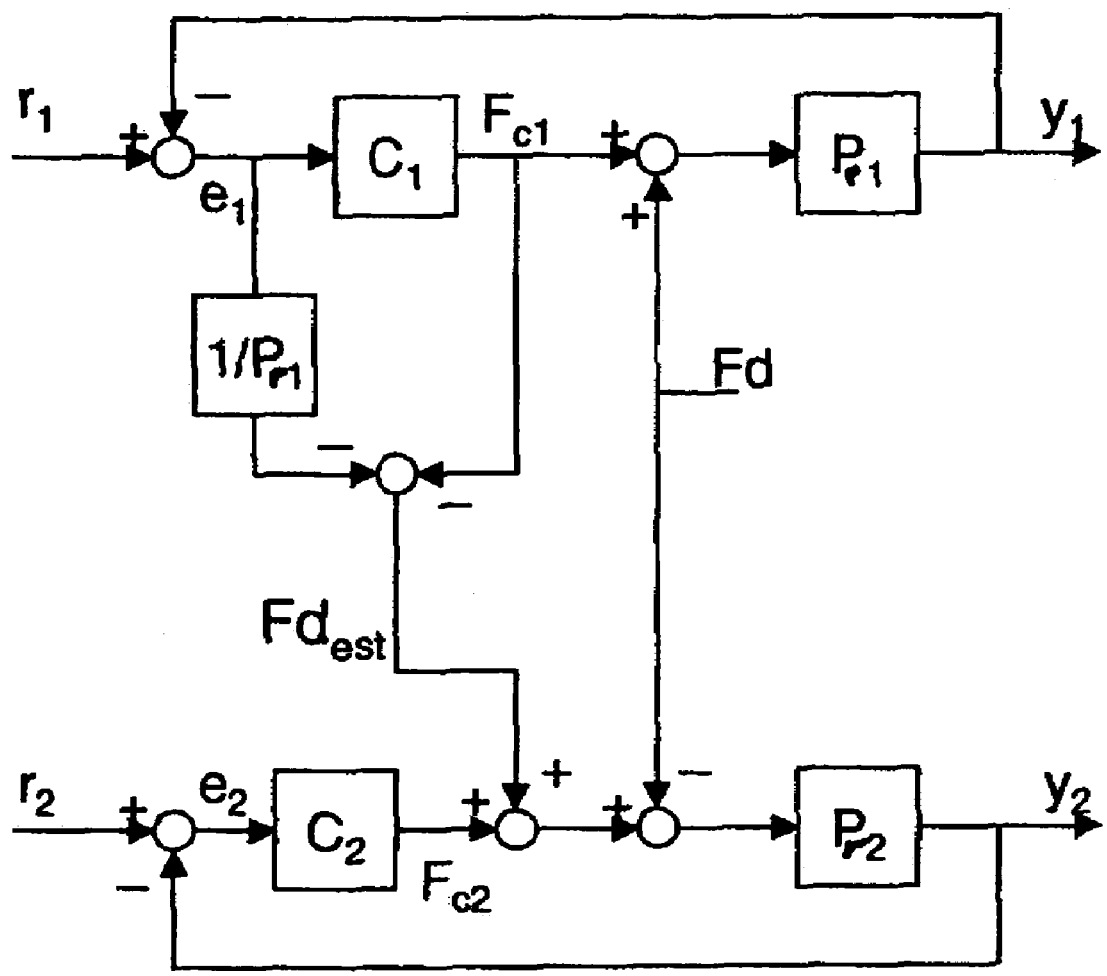
FIG. 6 depicts a control diagram of a part of a lithographic apparatus according to an embodiment of the invention.

FIG. 6 schematically shows a closed loop control loop for controlling a position of a liquid supply system of the lithographic apparatus, such as the seal member 12 as described above with reference to FIG. 5. The control loop includes a liquid supply system controller $C_1$, and a process, schematically indicated by $Pr_1$, the process including a transfer function from an input signal of an actuator for positioning the liquid supply system to an output signal of a position sensor for sensing a position of the liquid supply system. The quantity $y_1$ thus represents a position of the liquid supply system as measured by the position sensor. Likewise, FIG. 6 depicts a controller in a closed loop configuration for controlling a position quantity, in this embodiment a position, of the substrate table, and thus of the substrate itself. This control loop includes a controller $C_2$, and a process $Pr_2$, the process including a transfer from an input signal of an actuator for positioning the substrate table to an output signal of a sensor for sensing a position of the substrate table. The quantity $y_2$ thus represents a position of the substrate table as sensed by the position sensor. Thus, the liquid supply system control loop including the controller $C_1$ and the process $Pr_1$ controls in a closed loop configuration a position of the liquid supply system (in this example e.g. the seal member 12) while the controller $C_2$ in a closed loop configuration with the process $Pr_2$ controls a position of the substrate table and thus a position of the substrate. Each control loop is provided with a setpoint, indicated by $r_1$ and $r_2$ respectively to provide a setpoint position to the respective control loop, the signals $e_1$ and $e_2$ representing a position error, i.e. a difference between a desired position as provided by $r_1$ resp. $r_2$ minus an actual position as indicated by $y_1$ resp. $y_2$. The signals $F_{c1}$ and $F_{c2}$ each represent an output signal of the controller $C_1$ resp. $C_2$, and as these signals are provided to the respective process $Pr_1$, $Pr_2$, they represent an input signal to the respective actuator comprised in the respective process, thus representing a force acting on the liquid supply system (in the case of $Pr_1$) resp. a force acting on the substrate and substrate table (in the case of $Pr_2$). FIG. 6 further shows a disturbance force, indicated by Fd, acting on the process $Pr_1$, as well as on the process $Pr_2$. A summary of causes which may cause the disturbance force Fd will be provided below. According to physical law, an action force is equal to but opposite in sign to a reaction force, hence Fd acting on the processes $Pr_1$ and $Pr_2$ with opposite signs. The actuators comprised in the processes $Pr_1$, $Pr_2$ may include e.g. Lorentz actuators, Piezo actuators or pneumatic actuators. The sensors comprised in the processes $Pr_1$, $Pr_2$ to measure a position of the liquid supply system resp. the substrate table may include capacitive sensors, optical encoders or laser interferometers. In a practical, current implementation, both the position of the liquid supply system and the position of the substrate table are controlled with respect to a metrology frame, however any other reference for one or both of the positions may be applied too.

The disturbance force Fd may come into existence by a variety of causes: a flow of liquid (i.e. the immersion liquid) as well as a flow of a gas (such as the gases as mentioned in the descriptions to FIGS. 2-5) may cause disturbances, hence causing disturbance forces. Also, in some of the embodiments as shown with reference to FIGS. 2-5, a discharge is present to discharge the immersion liquid, the gas or a combination thereof. Such discharging may result in gas bubbles and/or liquid droplets in the discharge which may lead to sudden pressure fluctuations and/or flow fluctuations causing disturbance forces. A further cause of disturbance forces may be a position, e.g. a tilting, of the substrate. As a surface of the substrate is not sufficiently flat, a tilting of the substrate may be required to position a part of the substrate in an image plane of the projection system with a sufficiently high accuracy, such positioning, e.g. tilting may result in disturbances, hence causing disturbance forces acting on the liquid supply system. A further cause for disturbance forces may be found in a capillary effect. In the embodiments as shown in FIGS. 2-5, use is made of a liquid in between the substrate, the projection system and parts of the liquid supply. Attempting to displace e.g. the substrate table, the projection lens or the liquid supply system, forces come into effect caused by the capillary effect of the liquid. The disturbance force (assuming it acts on e.g. the liquid supply system) results in a reaction disturbance force on the substrate (and thus on the substrate table).

As explained above, the surface of the substrate, and hence the substrate and substrate table, need to be positioned highly accurately with respect to the projection system to obtain a highly accurate projection of the pattern on a target portion of the substrate. In a current implementation, a position error of 10 nm may be considered acceptably small. Contrary to this relatively accurate positioning, a position of the liquid supply system may show a comparably large tolerance, in a current implementation a position tolerance of 1 micrometer with respect to the surface of the substrate may be acceptable.

In an embodiment of the invention, a deviation of the substrate table may be corrected via a feedforward by estimating the disturbance force from a position (in general a position quantity) of the liquid supply system. The disturbance force acts on the liquid supply system as well as on the substrate table with a same magnitude, thus making it possible to estimate the disturbance force from the position of the liquid supply system as well. A transfer function from Fd to $y_1$ equals:

$$\frac{y_1}{F_d} = \frac{Pr_1}{1 + Pr_1 C_1} \qquad (1)$$

Thus, Fd may be constructed by:

$$F_d = \frac{1 + Pr_1 C_1}{Pr_1} y_1 \qquad (2)$$

This transfer function may however be unstable and very complex to implement because a transfer of the controller $C_1$ is comprised in it. In general, the transfer function of the controller $C_1$ may include a proportional, integrative and differential gain, a low pass filter and two or more notch filters. This may result in the situation that the above formula is of the $11^{th}$ other or more, assuming a $4^{th}$ other process $Pr_1$. In an embodiment of the invention, this formula may be rewritten in the below steps to a different formula which is more easy to implement, as will be explained below: rewriting the above formula, results in the expression $$F_d = \left(\frac{1}{Pr_1} + C_1\right) y_1 \qquad (3)$$

Assuming that $r_1$ equals zero, this formula can be rewritten as $$F_d = -\left(\frac{1}{Pr_1} + C_1\right) e_1 \qquad (4)$$

$$F_d = -\frac{1}{Pr_1} e_1 - C_1 e_1 \qquad (5)$$

$$F_d = -\frac{1}{Pr_1} e_1 - Fc_1 \qquad (6)$$

it will be appreciated that the resulting expression does not include the transfer function of $C_1$, thus making an implementation thereof much simpler, as the high order effects introduced by the transfer function of $C_1$ have been avoided. Expression 6 has been implemented in the control scheme depicted in FIG. 6. The estimator to provide an estimated disturbance force $Fd_{est}$ includes in the embodiment as shown in FIG. 6 a first path from an input of the controller $C_1$ to an output of the controller $C_2$, this path including a transfer function which is an inverse of the process transfer function $Pr_1$, and a second path from an output of the controller $C_1$ to an output of the controller $C_2$ includes a unity transfer function, thus arriving at an implementation of expression 6. The controllers $C_1$, $C_2$ as well as the estimator to estimate the disturbance force may be implemented in e.g. analogue electronics or digitally, e.g. making use of dedicated hardware, programmable hardware, and/or a microcomputer, microcontroller or plurality thereof being programmed with suitable program instructions.

Figure 7:
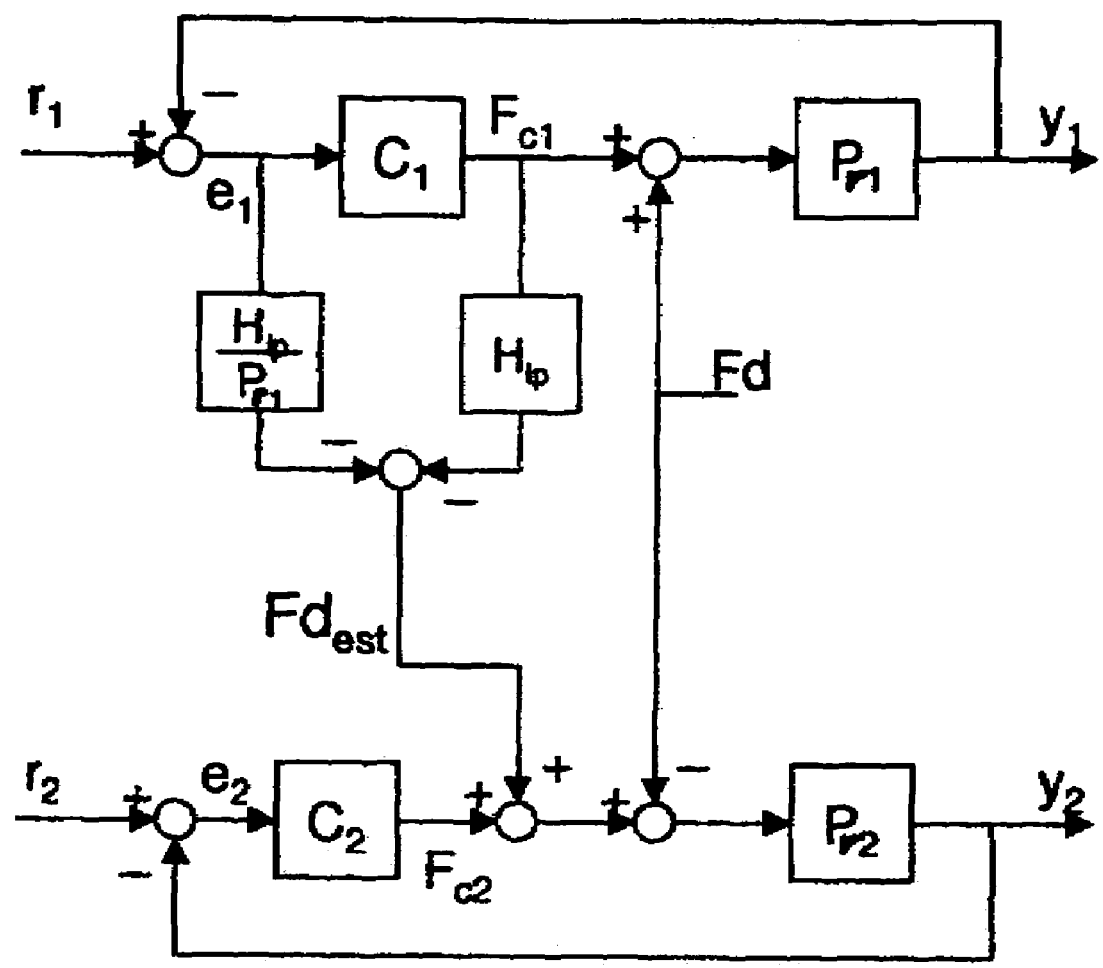
FIG. 7 depicts a control diagram of the lithographic apparatus according to an embodiment of the invention.

Another embodiment of the control system is shown in FIG. 7. In FIG. 7, the first and second path of the estimator to estimate the disturbance force each include a low pass filter, indicated by $H_{lp}$. In a practical embodiment, the process $Pr_1$ commonly includes a higher number of poles than zeros. As a consequence thereof, the inverse of $Pr_1$, as comprised in the first path of the disturbance force estimator, will in that case include a higher number of zeros than poles; thus not being "proper". To make this transfer function proper, in an analogue continuous domain a low pass filter may be added, while in a digital domain a time delay of e.g. one or more sample times may be added. To obtain a more accurate implementation, it may be advantageous to implement the same low pass filter or time delay in both the first and second path of the disturbance force estimator, as has been depicted in FIG. 7; only including the low pass filter or time delay in the first path, and not in the second path of the disturbance force estimator would result in a larger error in the estimation of the disturbance force. The low pass filter $H_{lp}$ as depicted in FIG. 7 may include a time delay in the digital domain as explained above.

An effect of the feedforward as explained with reference to FIGS. 6 and 7 will now be explained with reference to FIGS. 8a and b as well as FIGS. 9a-c. A liquid supply system, such as the seal member 12 shown in and explained with reference to FIG. 5, includes a mass of 0.5 kg with a resonance frequency at 200 Hz. A transfer function from an input signal of an actuator for positioning the liquid supply system to an output signal of a sensor for measuring a position of the liquid supply system is indicated by process $Pr_1$ in FIG. 8a, providing an amplitude and a phase diagram thereof. Similarly, FIG. 8b shows a frequency diagram of process $Pr_2$, i.e., a transfer function from an input signal of an actuator for positioning the substrate table to an output signal of a sensor for sensing a position of the substrate table, the substrate table in this example including a mass of 20 kg. Further, in this example controllers $C_1$ and $C_2$ each include a proportional, integrative and differential transfer functions as well as a low pass filter. The controllers provide the control loop of the liquid supply system with a bandwidth of 20 Hz and the control loop of the substrate table with a bandwidth of 100 Hz. In FIG. 9, a response to a 1 N stepwise force disturbance Fd is shown. FIG. 9a shows a position of the liquid supply system in response to the disturbance force. FIG. 9b shows in curve 1 a response of the substrate table, thus a position of the substrate table, without the estimation feedforward as described above with reference to FIGS. 6 and 7, while curve 2 of FIG. 9 shows a response of the substrate table to the stepwise force disturbance with the feedforward as shown and described with reference to FIGS. 6 and 7. It can be observed that an effect of the stepwise force disturbance in case that a force estimation feedforward is applied, is significantly reduced. Further, it can be seen that a bandwidth of the substrate table control loop is larger than a bandwidth of the liquid supply system control loop, as a response by the control loop to correct the disturbance is faster in FIG. 9b as compared to FIG. 9a. FIG. 9c shows the stepwise disturbance force as well as an estimation thereof as estimated by the feedforward according to FIGS. 6 and 7. It can been seen from FIG. 9c that the estimated disturbance force is practically equal to the stepwise force disturbance. Thus, with the feedforward as described above, an effect of a disturbance force on a position of the substrate table (and thus on a position of the substrate) can be significantly reduced, thus significantly increasing a position accuracy of a positioning of the substrate table hence allowing a more precise projection of a pattern onto the substrate as the substrate can be positioned more accurately with respect to a focus plane of the projection system of the lithographic apparatus.

In the above, it has been assumed that the reference value $r_1$ (see FIGS. 6 and 7) is zero. An effect of a non zero value at input $r_1$ on an estimation of the disturbance force will be described below. In case of a reference value at $r_1$ having a non-zero, however constant value, no difference will be observed in an estimation of the disturbance force in comparison with the above, as also in that case of a stationary non-zero reference input, the error signal $e_1$ will be equal to zero. This is because the process $Pr_1$ commonly includes an integrative process, i.e. once the liquid supply system has been positioned by the respective actuators, no input signal to $Pr_1$ is required for further positioning, as the liquid supply system from that moment on (in an ideal case showing zero disturbances) remains in that position. Due to this substantially integrative effect, a zero value at $e_1$ will be observed at a non-zero, constant value at $r_1$. In a case where $r_1$ shows a dynamic transition, a change in an error signal $e_1$ as well as a change in a controller output signal $F_{c1}$ may be a result thereof. The force estimator feedforward would then estimate a force based on these signal changes, however not taking into account that these signals in the control loop are not related to an interaction by a disturbance force but are due to a change in the reference value itself. Thus, in the control diagram as shown in FIGS. 6 and 7, a disturbance force estimation signal would be generated, hence compensation for a disturbance force that may not even be present at that moment, thus resulting in a false estimation. This effect however is counteracted by a feedforward (not shown in FIG. 6 and FIG. 7) in the liquid supply system control loop. The feedforward in an ideal case includes a transfer function equal to an inverse of the process transfer function $Pr_1$. An input of the feedforward is connected to the reference value $r_1$ and an output of the feedforward is connected to an input of the process transfer function $Pr_1$. Thus, when a dynamic change occurs at the reference input $r_1$, this change will via the feedforward having a transfer function being an inverse of $Pr_1$ result in an input signal to $Pr_1$ being suitable to drive $Pr_1$ as to react on the change in the reference value. As a result thereof, the controller $C_1$ does not require to perform any action, as an output of the process $Pr_1$, thus $y_1$ will follow a change in $r_1$ due to the feedforward, thus as a result thereof the error signal $e_1$ remains zero (or at least does not change due to the change in the reference value), and thus $F_{c1}$ also does not change, and hence no effect on the estimation of the disturbance force is observed due to the beneficial action of the feedforward from $r_1$ to an input of the process transfer function $Pr_1$, the feedforward preferably having a transfer function equal to an inverse of $Pr_1$.

The method according to an embodiment of the invention includes: holding a substrate W by a substrate table WT; controlling a position quantity of the substrate table WT by a substrate table controller $C_2$ (e.g. in a closed loop configuration); positioning a first movable element (such as the liquid supply system 12) with respect to the substrate, the first movable element being in operation in contact with a surface of the substrate; estimating a disturbance force Fd at least from a position quantity of the first element; providing a disturbance force feedforward signal based on the estimated disturbance force via a feedforward control path to the substrate table controller $C_2$; and transferring a pattern from a patterning device onto the substrate.

The feedforward according to an embodiment of the invention may be applied to provide an estimation for a disturbance force between any first and second element, the first and second element being in contact with each other directly or indirectly. As the disturbance force acts on both the first and second elements, however with opposite signs (as an action force equals an opposite of a reaction force), the force can be estimated from a position quantity of e.g. the first element to provide a disturbance force estimation signal to at least partly correct a position quantity of the second element. The second element may include the substrate table to hold the substrate. The first element may include a liquid supply system such as the seal member as described above. Alternatively the first element may include a liquid removal system to remove a remainder of the liquid (e.g. liquid supplied and not removed by the liquid supply system) from the substrate, or a level sensor to measure a level of the substrate (an example of such a sensor being an air gauge, i.e. a level sensor to measure a level of the surface of the substrate by detecting pressure differences in a stream of a gas). Instead of or in addition to the above embodiments, the first and second movable elements may further include any other elements, the first movable element may include the liquid supply system while the second movable element includes the projection lens, the first and second movable elements may each include a lens element within the projection lens, the lens elements mutually interacting with each other, or any other element which is movable and/or a position quantity of which is controlled by a controller.

The term movable element is to be understood as including an element of which a position is changeable and/or may change during operation of the lithographic apparatus, however the term movable element may also include an element of which a position is substantially stationary during operation of the lithographic apparatus, in which case the term movable may refer to a movability to counteract or compensate for any effect that would tend to displace the element. The movable element may thus (although substantially stationary during operation) e.g. be connected to an actuator which is able to influence a position quantity of the respective element, the actuator being driven e.g. to correct or stabilize the position quantity of the respective element.

The position quantity may include a position, a velocity, an acceleration, a jerk, or any combination thereof, including deviations of the measured quantities from their desired values. Also, the position quantity may be derived from more than one measurement system, for example the position in a Z direction may be derived from three sensors, each measuring the position of one spot of an element; or the position may be derived from any other combination of measurement systems.

The term "in contact with" is to be understood as including a direct, physical contact, however it may also include any other type of contact, e.g. a contact via an intermediary medium, such as a liquid, a gas, etc. Also, the term "in contact with" includes a contact established via an intermediary (e.g. solid, rigid or deformable) structure.

The term closed loop refers to any type of control arrangement which is arranged to make use of an output quantity of a process which is to be controlled in the loop, to effect an input quantity of the process. Further output quantities and further input quantities of the process may be present. Also, further inputs to the loop may be present.

As described above, the controller may be implemented making use of analogue or digital electronics. Other implementations with in the scope of the invention may include but are not restricted to a pneumatic controller making use of any fluid such as a liquid or a gas, a mechanical controller or any other suitable controller.

The wording "a feedforward control path to provide a disturbance force feedforward signal to the second element controller" may include a feedforward control path to an output of the second element controller, to an input of the second element controller, or to any other suitable signal in a closed loop control loop in which the second element controller may preferably be comprised.

FIG. 6 and FIG. 7 depict a second element controller in a closed loop configuration, however any other suitable controller configuration, such as a controller in an open loop configuration, a controller in a feedforward configuration etc. is comprised in the invention also.

Further, within the scope of the invention, the first element controller and associated feedback loop may be left away. In that case, the feedforward control path in a preferred embodiment comprises a transfer function equal to an inverse of the first element positioning process transfer function, an input of the feedforward control path being connected to the first element sensor output signal. With this preferred embodiment, an effective estimation and compensation of the disturbance force is obtained.

The first element sensor to determine a position quantity of the first element may include any suitable position sensor known in the art, e.g. interferometric, capacitive, optical encoder and others.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

What is claimed is:

1. A system for use in a lithographic apparatus comprising:
    a first movable element;
    a second movable element, a surface of the second movable element being in contact with the first movable element;
    a second element position controller configured to control a position quantity of the second movable element, and
    a feedforward control path configured to provide a disturbance force feedforward signal to the second element controller, the feedforward control path comprising a disturbance force estimator configured to estimate a disturbance force from an actual position quantity of the first movable element.

2. The system of claim 1, wherein the position quantity includes a position, a velocity, an acceleration, a jerk, or any combination thereof.

3. The system of claim 1, wherein the contact includes a direct contact or a contact using an intermediary medium.

4. The system of claim 3, wherein the intermediary medium includes a liquid or a gas.

5. The system of claim 1, wherein the second movable element comprises a substrate table constructed to hold a substrate, the second element controller comprising a substrate table controller to control a position quantity of the substrate table, the first movable element being in operation in contact with a surface of the substrate held by the substrate table.

6. The system of claim 2, wherein the first movable element comprises at least a liquid supply system arranged to contain a liquid to transfer a beam to the substrate held by the substrate table, a liquid removal system arranged to remove a remainder of the liquid from the substrate, or a level sensor configured to measure a level of the substrate.

7. The system of claim 1, further comprising a first element controller to control the actual position quantity of the first movable element, the disturbance force estimator being configured to estimate the disturbance force from a signal of the first element controller.

8. The system of claim 7, wherein the disturbance force estimator comprises a first path from a controller input of the first element controller to a controller output of the second element controller, and a second path from a controller output of the first element controller to the controller output of the second element controller.

9. The system of claim 8, wherein the first path comprises a transfer function, said transfer function being an inverse of a first element positioning process transfer function determining a relationship between an actuator input signal of a first element positioning actuator and a first element sensor output signal to determine a position quantity of the first element, and wherein the second path comprising a unity transfer function.

10. The system of claim 9, wherein each of the first and second paths comprise a low pass filter.

11. The system of claim 6, wherein each of the first and second paths further comprise a time delay.

12. The system of claim 1, wherein the positioning quantity of each of the first and second elements comprises a position, a velocity, an acceleration, or a jerk.

13. A device manufacturing method comprising:
    a) controlling a position quantity of a substrate table using a substrate table controller;
    b) positioning a first movable element with respect to the substrate, the first movable element being in contact with a surface of the substrate;
    c) estimating a disturbance force from an actual position quantity of the first element;
    d) providing a disturbance force feedforward signal based on the estimated disturbance force via a feedforward control path to the substrate table controller, and
    e) transferring a pattern from a patterning device onto the substrate.

14. The method of claim 13, wherein the first element comprises a liquid supply system to arranged to contain a liquid to transfer a beam to the substrate held by the substrate table, a liquid removal system to remove a remainder of the liquid from the substrate, and a level sensor to measure a level of the substrate.

15. A computer program stored on a machine readable medium and comprising machine executable instructions executable by a computer to perform a method of controlling a position quantity of a substrate table using a substrate table controller with respect to a first movable element, the first movable element being in contact with a surface of the substrate, the method comprising:
estimating a disturbance force from an actual position quantity of the first element,
providing a disturbance force feedforward signal based on the estimated disturbance force via a feedforward control path to the substrate table controller, and
controlling the position quantity of the substrate table based on the disturbance force feedforward signal.

16. A lithographic apparatus comprising:
    (a) an illumination system configured to condition a beam of radiation;
    (b) a patterning device support configured to support a patterning device, the patterning device configured to pattern the beam of radiation to form a patterned beam of radiation;
    (c) a substrate support configured to hold a substrate;
    (d) a projection system configured to project the patterned beam of radiation onto a target portion on the substrate, and
    (e) a positioning system configured to position a first movable element relative to a second movable element, a surface of the second movable element being in contact with the first movable element, the system including
        (i) a second element position controller configured to control a position quantity of the second movable element, and
            (ii) a feedforward control path configured to provide a disturbance force feedforward signal to the second element controller, the feedforward control path comprising a disturbance force estimator configured to estimate a disturbance force from an actual position quantity of the first movable element.

17. A system for use in a lithographic apparatus comprising:
    a substrate table configured to hold a substrate;
    a substrate table position controller configured to control a position quantity of the substrate table;
    a liquid supply system configured to provide liquid between a projection system and the substrate, the liquid supply system being movable with respect to the substrate table; and a feedforward control path configured to provide a disturbance force feedforward signal to the substrate table position controller, the feedforward control path comprising a disturbance force estimator configured to estimate a disturbance force from an actual position quantity of the liquid supply system.

18. The system of claim 17, wherein the position quantity includes a position, a velocity, an acceleration, a jerk, or any combination thereof.

19. The system of claim 17 further comprising a liquid supply system position controller configured to control the actual position quantity of the liquid supply system, the disturbance force estimator configured to estimate the disturbance force from a signal of the liquid supply system position controller.

* * * * *